(12) United States Patent
Shih

(10) Patent No.: US 6,856,269 B1
(45) Date of Patent: Feb. 15, 2005

(54) D/A CONVERSION METHOD AND D/A CONVERTER

(75) Inventor: Ming-Yung Shih, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/844,359

(22) Filed: May 13, 2004

(51) Int. Cl.[7] ............................................. H03M 3/00
(52) U.S. Cl. ...................... 341/145; 341/144; 341/152
(58) Field of Search ........................ 341/53, 144–145, 341/152

(56) References Cited

U.S. PATENT DOCUMENTS 5,764,173 A * 6/1998 Flynn .......................... 341/152
5,774,084 A * 6/1998 Brombaugh et al. ........ 341/152

* cited by examiner

*Primary Examiner*—Michael Tokar
*Assistant Examiner*—Khai Nguyen
(74) *Attorney, Agent, or Firm*—Birch, Stewart, Kolasch & Birch, LLP

(57) ABSTRACT

A D/A conversion method and D/A converter. First, an m-bit data is input, wherein the m-bit data includes upper n bit data and lower m−n bit data. Then, a first n bit data is obtained by transforming the upper n bit data. Finally, the upper n bit data is applied to an n-bit D/A converter for a first duration and the first n-bit data is applied to the n-bit D/A converter for a second duration, according to the lower m−n bit data.

19 Claims, 3 Drawing Sheets

D/A CONVERSION METHOD AND D/A CONVERTER

BACKGROUND OF THE INVENTION

1. Field of the Invention

The present invention relates to a Digital-to-Analog (D/A) conversion, and more particularly, to a D/A conversion method and a D/A converter for converting an m-bit digital signal with an n-bit D/A digital converter.

2. Description of the Related Art

Recently, great progress has been made in digital processing techniques for conventional analog processing systems, such as mobile phones, digital cameras and network phones. Digital-to-analog (D/A) converters capable of converting digital signals into analog signals are required for such digital processing systems.

FIG. 1 shows a traditional D/A conversion. By inputting m-bit data into a m-bit D/A converter, (ex: R-2R ladder D/A converters for example). The m-bit data is converted to corresponding analog data by the internal circuit of the m-bit D/A converter 1. The required circuit area will be much larger, however, if the bit number of the input digital data of the D/A converter 1 is increased. For example, if the bit-number of the input digital data is increased from m to m+1, an m+1-bit D/A converter must be used to receive the m+1 digital data. Hence, the circuit area must be larger.

SUMMARY OF THE INVENTION

Accordingly, an object of the present invention is to provide a D/A conversion method and a D/A converter for reducing required circuit area.

In order to achieve the above object, the invention provides a D/A conversion method.

First, an m-bit data is inputted, wherein the m-bit data includes upper n bit data and lower m−n bit data. Then a first n bit data is obtained by converting the upper n bit data. Finally, the upper n-bit data is applied to an n-bit D/A converter for a first duration and the first n-bit data to the n-bit D/A converter for a second duration according to the lower m−n bit data.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
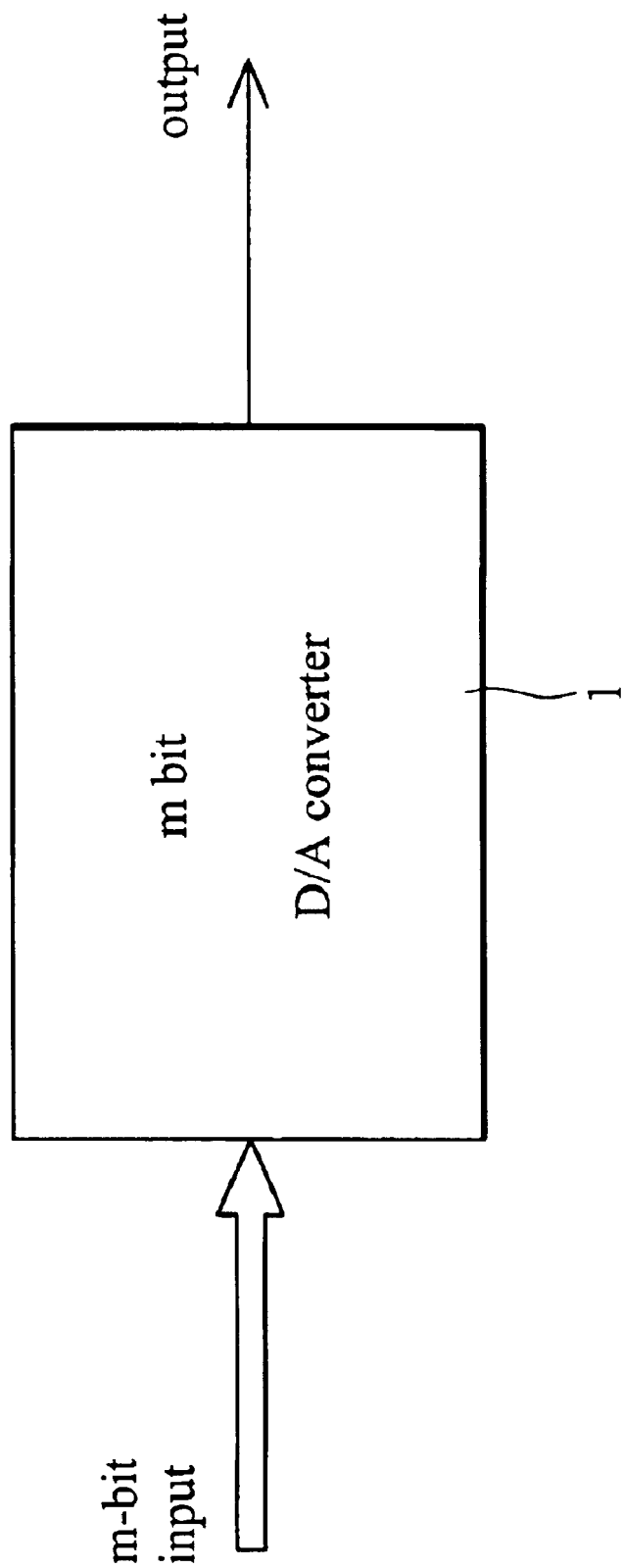
FIG. 1 is a block circuit diagram showing a conventional m-bit converter.
Figure 2:
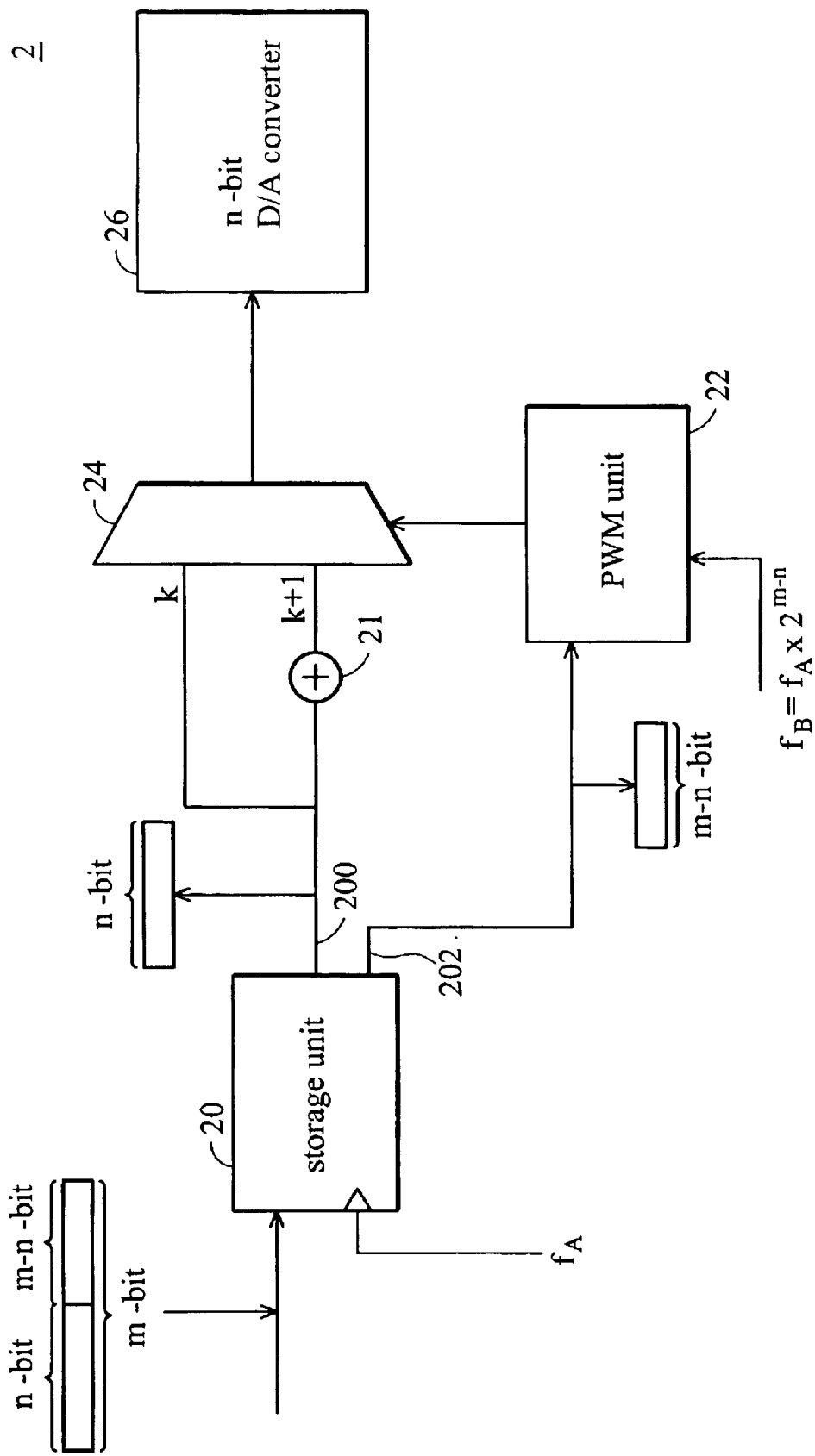
FIG. 2 is a block circuit diagram showing a D/A converter of the invention.

FIG. 2 shows a block diagram according of a preferred embodiment of the present invention. The D/A converter 2 has a storage unit 20, a pulse width modulator (called PWM hereafter) 22, a multiplexer 24 and an n-bit D/A converter 26.

The storage unit 20 is a register for receiving the m-bit data. An operation clock with a frequency $f_A$ is applied to the storage unit 20, thus the first cycle is $T_A=1/f_A$. The m-bit data includes upper n-bit data and lower m−n bit data. The upper n-bit digital data and the lower m−n bit data is output through a first output terminal 200 and a second output terminal 202 of the storage unit 20. The lower m−n bit data is applied to the PWM 22 for modulating the pulse width of an output control signal. An operation clock with a frequency $f_B$ is applied to the PWM 22. The second cycle can be represented as the following formula; $T_B=1/f_B$, for $f_B=f_A \times 2^{m-n}$, $T_B=\frac{1}{2}^{m-n} \times T_A$. The upper n bit data and a first n bit data obtained by transforming the n bit data are applied to the multiplexer 24, wherein the first n-bit data is the upper n-bit data plus one added by an adder set between the output 200 of the storage unit 20 and the multiplexer 24. The multiplexer 24 is controlled by a control signal output from the PWM 22 for determining whether the upper n bit data or the first n bit data is output. The n-bit D/A converter 26 is coupled to the multiplexer 24 for receiving the data output from the multiplexer 24 for converting the data to a corresponding analog signal.

In practice, if the input m-bit data is 16-bit digital data, m=16, and the n-bit D/A converter 26 is a 12-bit D/A converter. According to the previous description, m is equal to 16 and n is equal to 12. The upper 12 bits of the 16-bit digital data are input into the multiplexer 24, and the remaining lower 4 bits data and an operation clock with second cycle $T_B$ are input to the PWM unit 22 to control the pulse width of the control signal of the PWM unit 22, wherein the second cycle can be represented as the following formula: $T_B=\frac{1}{2}^{m-n} \times T_A$. The multiplexer 24 is controlled by the control signal output from the PWM unit 22 and outputs the first n-bit data for $P \times T_B$ seconds (first duration) and the n-bit data for $(2^{m-n}-p) \times T_B$ seconds (second duration). Wherein the decimal value of the first n-bit data is k+1, and the decimal value of the n-bit data is k, p is the decimal value of the lower m−n bit data.

Figure 3:
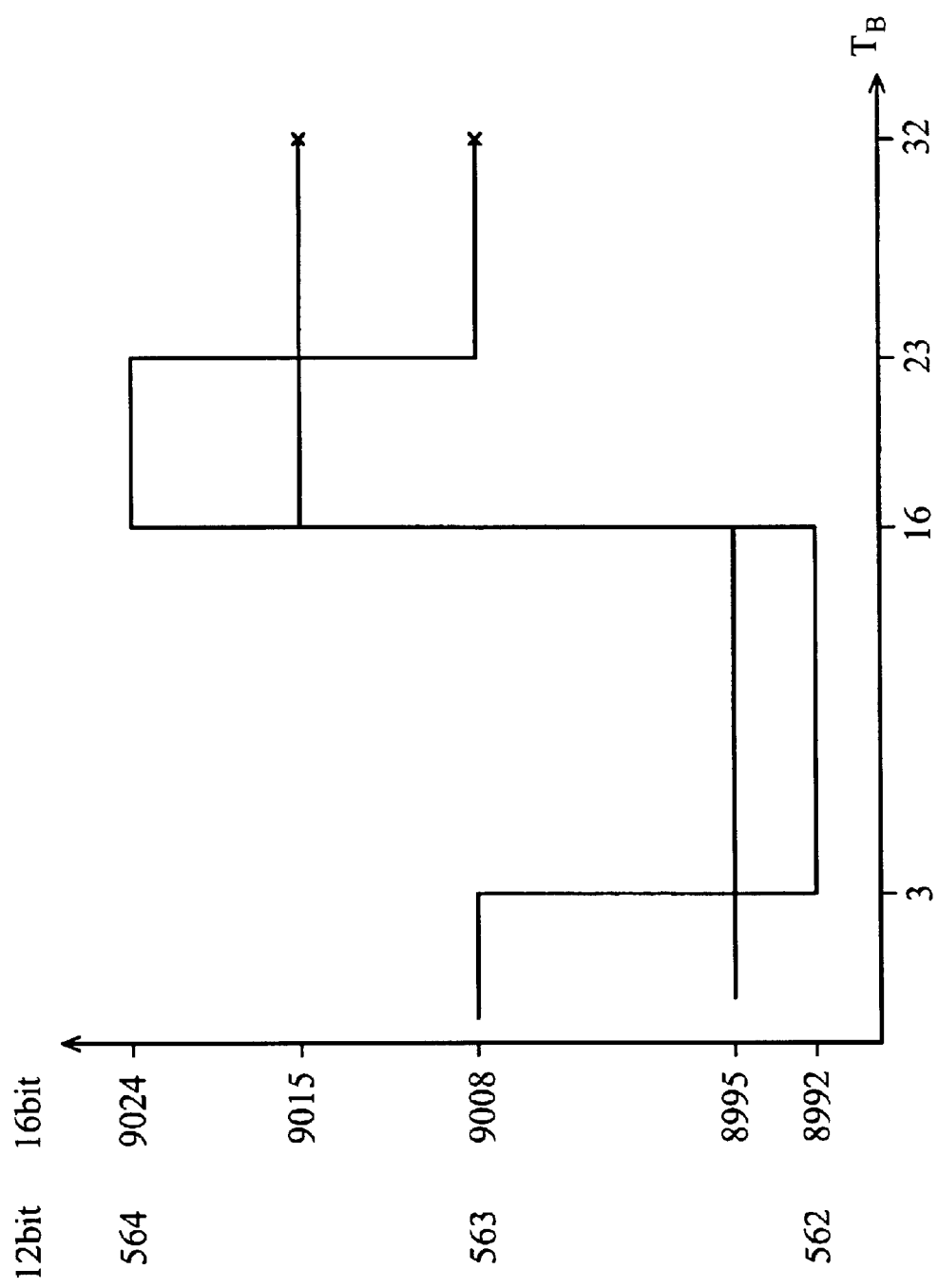
FIG. 3 is a schematic diagram of the invention.

Referring to FIG. 2 and FIG. 3, if the input 16-bit data is 2323h, the decimal value of 2323h is 8995d. If the n-bit D/A converter 26 is a 12-bit D/A converter, then n is equal to 12, and m−n is equal to 4. The second cycle $T_B$ of the PWM unit 22 is $\frac{1}{2}^4$ times the first cycle $T_A$. The upper 12-bit data is 232h and the lower 4-bit data is 4h. The decimal value of the first n-bit data k+1=233h=563d is input into the multiplexer 24 for $3 \times T_B$ (P=3) seconds. The n-bit data k=232h=562d is input to the multiplexer 24 for $9 \times T_B$ seconds.

The invention provides a D/A conversion method and a D/A converter by using an n-bit D/A converter to convert an m-bit data, wherein m≧n. Thus the circuit area of the D/A converter is reduced.

While the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A D/A conversion method comprising the steps of:

inputting an m-bit data, wherein the m-bit data includes upper n bit data and lower m−n bit data;

obtaining a first n-bit data by transforming the upper n-bit data; and applying the upper n-bit digital data to a n-bit D/A converter for a first duration and the first n-bit data to the n-bit D/A converter for a second duration, according to the lower m−n bit data.

2. The D/A conversion method as claimed in claim 1, wherein the m-bit data is input by an operation clock with a first cycle.

3. The D/A conversion method as claimed in claim 1, wherein the m-bit data is input to a storage unit.

4. The D/A conversion method as claimed in claim 1, wherein the first n-bit data is the upper n-bit data plus one.

5. The D/A conversion method as claimed in claim 1, wherein the upper n-bit data and the first n-bit data are output to a multiplexer.

6. The D/A conversion method as claimed in claim 5, wherein the multiplexer is controlled by a control signal output by a pulse width modulator, the clock cycle of the control signal is the sum of the first duration and the second duration, the first duration is equal to a pulse width time of the control signal.

7. The D/A conversion method as claimed in claim 5, wherein the multiplexer is controlled by the control signal for outputting the upper n-bit digital data to the n-bit D/A converter for a first duration and the first n-bit data to the n-bit D/A converter for a second duration.

8. The D/A conversion method as claimed in claim 6, wherein an operation clock with a second cycle is applied to the pulse modulator, and the second cycle is $\frac{1}{2}^{m-n}$ times the first cycle.

9. The D/A conversion method as claimed in claim 6, wherein the first duration is directly proportional to the decimal value of the lower m−n bit data.

10. The D/A conversion method as claimed in claim 6, wherein the second duration is directly proportional to $2^{m-n}-p$, wherein p is the decimal value of the lower m−n bit data.

11. A D/A converter, comprising:
    a storage unit for receiving m-bit data, wherein the m-bit data includes upper n-bit digital data and lower m−n bit data;
    a multiplexer coupling to the storage unit for receiving the upper n-bit data and a first n-bit data transformed from the upper n-bit data;
    a pulse width modulator coupling to the storage unit and controlled by the lower m−n bit data to output the upper n-bit digital data for a first duration and the first n-bit data for a second duration; and
    an n-bit D/A converter unit coupling to the multiplexer for receiving and transforming the upper n bit data and the first n-bit data to a corresponding analog signal.

12. The D/A converter as claimed in claim 11, wherein an operation clock with a first cycle is applied to the storage unit.

13. The D/A converter as claimed in claim 11, wherein the storage unit is a register.

14. The D/A converter as claimed in claim 11, wherein the first n-bit data is the upper n-bit data plus one.

15. The D/A converter as claimed in claim 11, wherein an operation clock with a second cycle and the lower m−n bit data is applied to the pulse width modulator, and a control signal is output from the pulse width modulator for controlling the multiplexer, wherein the clock cycle of the control signal is the sum of the first duration and the second duration; the first duration is equal to a pulse width time of the control signal.

16. The D/A converter as claimed in claim 11, wherein the multiplexer is controlled by the control signal for outputting the upper n-bit digital data for a first duration and the first n-bit data for a second duration.

17. The D/A converter as claimed in claim 15, wherein the second cycle is $\frac{1}{2}^{m-n}$ times the first cycle.

18. The D/A converter as claimed in claim 16, wherein the first duration is directly proportional to the decimal value of the lower m−n bit data.

19. The D/A converter as claimed in claim 16, wherein the value of the second duration is directly proportional to $2^{m-n}-p$, wherein p is the decimal value of the lower m−n bit data.

* * * * *